United States Patent

[11] 3,601,772

[72] Inventor Lloyd Mancini
New Cumberland, Pa.
[21] Appl. No. 39,043
[22] Filed May 20, 1970
[45] Patented Aug. 24, 1971
[73] Assignee Berg Electronics, Inc.
New Cumberland, Pa.

[54] HEADER BLOCK ASSEMBLY
7 Claims, 5 Drawing Figs.

[52] U.S. Cl. .... 339/156 R, 339/17 LC, 339/198 G, 339/210 M
[51] Int. Cl. .... H01r 9/22, H05k 1/04
[50] Field of Search .... 339/17 R, 17 F, 17 L, 17 N, 17 LC, 17 LM, 17 M, 107, 176 M, 176 MF, 156 R, 154 R, 154 A, 198 R, 198 G, 198 GA, 198 H, 210, 218 R, 218 M

[56] References Cited
UNITED STATES PATENTS
2,864,977 12/1958 Witt et al. .... 317/101
3,226,669 12/1965 Lutz .... 339/198 (R)
2,724,095 11/1955 Rudner .... 339/192
FOREIGN PATENTS
1,134,588 12/1956 France .... 339/198 (H)
1,487,520 4/1969 Germany .... 339/198 (H)

*Primary Examiner*—Stephen J. Novosad
*Assistant Examiner*—Lawrence J. Staab
*Attorney*—Thomas Hooker

ABSTRACT: A header block assembly for interconnecting circuit elements formed of a number of insulating wafers secured together with contact wires extending between sides of the assembly along the interfaces between wafers. The wires are fitted in grooves formed in one wafer below the interface. Ridges formed in the adjacent wafer extend into the grooves to form a tight interference fit which prevents reduction of cross resistance between wires due to seepage of fluids into the interface between wafers.

INVENTOR.
LLOYD MANCINI
BY
THOMAS HOOKER,
His Attorney

HEADER BLOCK ASSEMBLY

The invention relates to a header block assembly for interconnecting circuit boards and connector blocks or other like circuit elements. Conventionally, as disclosed in Berg Pat. application Ser. No. 817,010 for Header Block Assembly, filed Apr. 17, 1969, now U.S. Pat. No. 3,539,974, header block assemblies are made by sandwiching together a number of molded plastic wafers. Wire receiving grooves are formed in each wafer at an interface surface. The grooves have a depth approximately equal to the diameter of the wire so that when the header block is assembled, the wires in the grooves touch or are immediately adjacent the interface with the adjacent wafer.

Conventional header block assemblies secured together by means of a solvent which is applied at the interface between adjacent wafers. The solvent tends to dissolve away the plastic between adjacent wires and create voids in the assembly at the interfaces between wafers. Water tends to seep into these voids and reduce the cross resistance between adjacent wires. The water may originate from a bath used to remove a water soluble soldering flux applied when the assembly is soldered to a circuit board. In time, sufficient water may condense from the atmosphere, find its way into the assembly and reduce cross resistance between wires.

If a solvent-formed connection is not used to secure adjacent wafers together, there is a likelihood that voids will exist in the interface between adjacent wires so that the cross resistance may be reduced. Regardless of the type of wafer joint, water seeps along the wires and into the interior of the wafer assembly so that it will fill any voids between wires and reduce cross resistance.

In the improved header block assembly disclosed herein, the wires in the header block are confined in deep grooves formed in one wafer with ridges formed on the adjacent wafer extending into the grooves along their length so that the wires are located below the interface between the adjacent wafers. There is a tight interference fit between the ridges and grooves. When a header block assembly is formed between wafers having ridges and grooves, as described, the solvent does not form voids extending between adjacent wires, and water cannot seep into the interface and reduce the resistance between the wires. Regardless of how the wafers are secured together, the reduction of cross resistance between wires due to fluid seepage is eliminated. Additionally, the groove and ridge construction results in a physically stronger header block assembly.

IN THE DRAWINGS

Figures 1, 2:
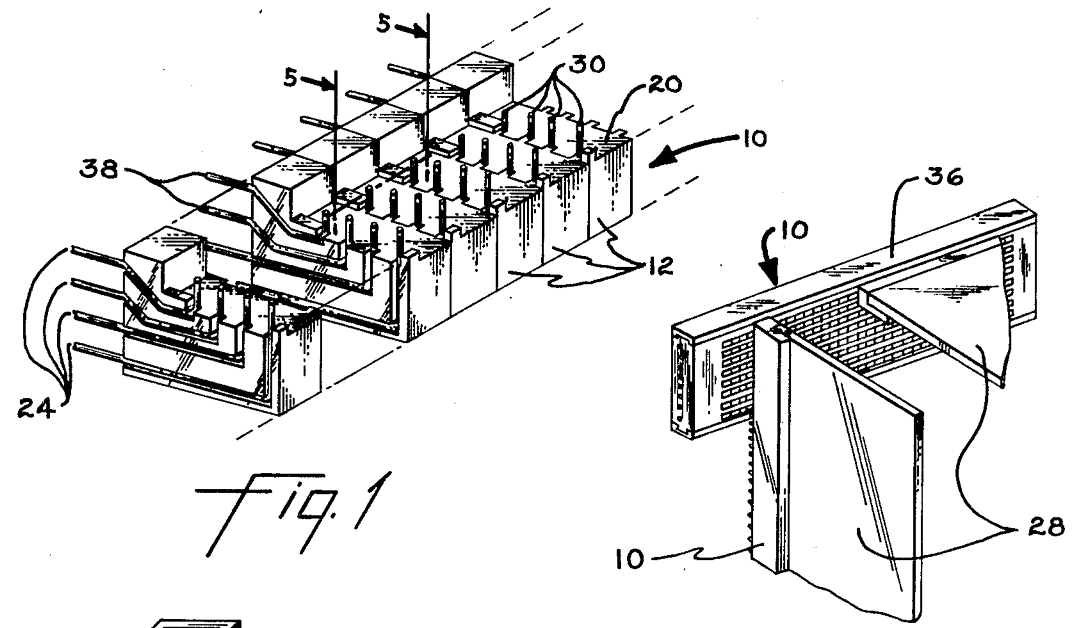
FIG. 1 is an exploded perspective view of a header block assembly according to the invention.
FIG. 2 illustrates a use of the header block assembly.
Figure 3:
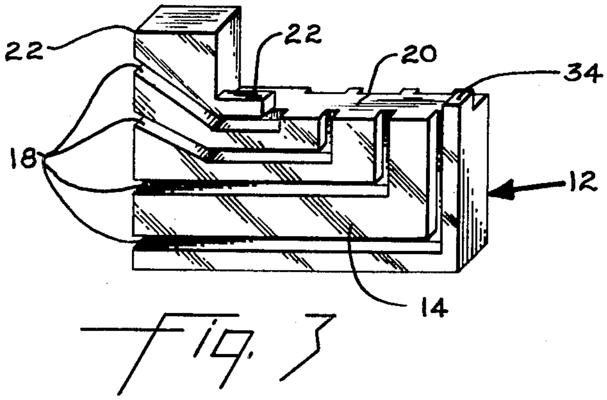
FIGS. 3 and 4 are perspective views of different sides of wafers used to form the assembly.
Figure 4:
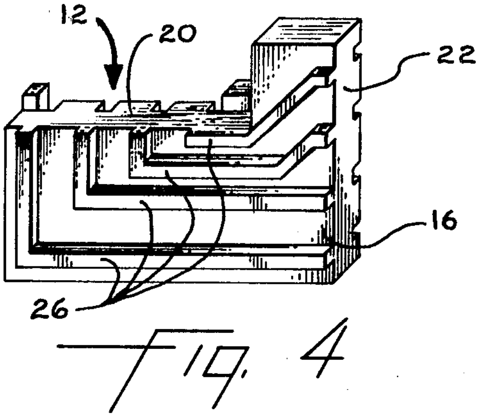
Figure 5:
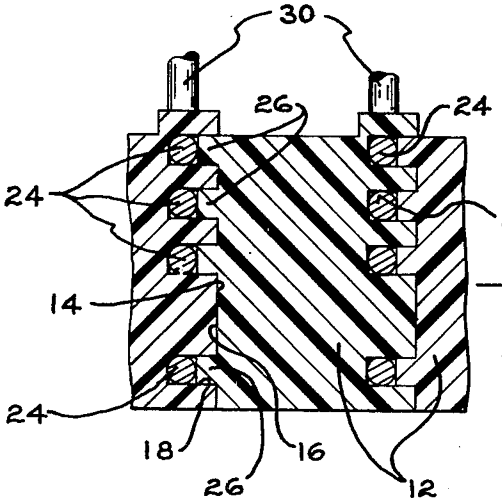
FIG. 5 is a sectional view taken along line 5—5 of FIG. 1.

Header block assembly 10 is formed form a plurality of like plastic wafers or spacers 12 which are sandwiched together at adjacent parallel side faces 14 and 16. Each wafer 12 is provided with a number of wire receiving grooves 18 in side face 14. The grooves 18 extend along the side face from edge 20 to edge 22. Wires 24 are confined in the grooves 18 with the ends of the wires projecting from the edges 20 and 22 as illustrated in FIG. 1. The grooves 18 have a width approximately equal to the diameter of the wires 24 and a depth greater than the diameter of the wires so that, as shown in FIG. 5, the wires in the assembly are located below surface 14.

Ridges 26 are formed on surface 16 of wafer 12 and have the same configuration as grooves 18 so that when adjacent wafers are sandwiched together, the ridges 26 extend into the grooves 18 of the adjacent wafer. As shown in FIG. 5, the sides of ridges 26 abut the sides of the grooves 18 to form a tight interference fit with the grooves 18. The ridges extend into the grooves so that the ends of the ridges preferably abut wires 24. With this construction, the individual wires 24 which are confined between adjacent wafers are positioned below the interface between surfaces 14 and 16.

When the assembly 10 is made up from individual wafers 12 and wires 24, the wires are first positioned in grooves 18 and the wafter are sandwiched together with ridges 26 fitted in the grooves after a solvent is applied to the interfaces between wafers. The solvent forms a connection between the adjacent wafers and holds the assembly together. Because the ridges 26 form a tight interference fit with grooves 28, the application of the solvent at the interface between adjacent wafers does not result in the formation of voids extending between adjacent wires in the assembly.

After a header block assembly is formed from wafers 12 and wires 24, as described, a circuit board 28 may be secured to the assembly by first positioning wire ends 30 in holes formed in the circuit board and then applying solder to the circuit board and assembly to form electrical connections between the wire ends and printed circuit paths on the board. After the soldering operation, the circuit board and assembly are washed in order to remove undesired solder and flux from the assembly. Because of the elimination of voids along the wafer interfaces, the soldering and washing steps do not effect the resistance between wires.

The wafers 12 are provided with extensions 32 and 34 above side 20 so that the circuit board 28 is held above side 20. The spacing between the circuit board and assembly prevents solder wicking between adjacent wire ends 30 during the soldering step.

The circuit board 28 with assembly 10 secured thereto may be attached to a connector block 36 as shown in FIG. 2 by inserting wire ends 38 into wire receiving openings in the block. FIG. 2 is illustrative of one of a number of ways in which header block assembly 10 may be used to connect circuit elements. In any application, the ridge and groove construction which results in positioning the wires 24 below the interface between adjacent wafers prevents reduction of the insulation value of the plastic wafers and also results in a header block assembly which is stronger than conventional wafer-type header block assemblies.

The ridge and groove construction is useful in preventing the reduction of cross resistance between wires in a wafer-type header block assembly whether the wafers are secured together by a solvent, glue or other type connection. The tight interference fit prevents low resistance paths from forming between adjacent wires.

While I have illustrated and described a preferred embodiment of my invention, it is understood that this is capable of modification, and I therefore do not wish to be limited to the precise details set forth but desire to avail myself of such changes and alterations as fall within the purview of the following claims.

What I claim as my invention is:

1. A header block assembly comprising two elements made of insulating material with a side face formed on each element, said elements being secured together with said side faces abutting each other to form an interface between said elements, a wire receiving groove formed in one side face, said groove extending between points on the edge of such face, a wire positioned in the bottom of said groove below said interface with the wire ends extending outwardly of said assembly, a ridge on the other side face, said ridge extending across said interface and into said groove along its length with the sides of said ridge engaging the side of said groove to form a tight interference fit therebetween, and a second wire confined between said elements, said second wire extending between points on the edge of said interface with the ends of such wire extending outwardly of said assembly.

2. A header block assembly as in claim 1 wherein said side faces are planar and one end of each wire projects from said assembly in the same direction as an end of the other wire.

3. A header block assembly as in claim 1 wherein said elements are secured together by a solvent-formed connection.

4. A header block assembly as in claim 3 wherein said elements are formed of a plastic material.

5. A header block assembly comprising a plurality of elements made of insulating material and each having opposite parallel side faces, said elements being sandwiched together at adjacent side faces to form an elongated assembly with an interface between each adjacent pair of elements, a pair of wire receiving grooves formed in one side face at each interface, each groove extending between points on the edge of such side face, a wire positioned in the bottom of each groove below the interface with the wire ends extending outwardly of said assembly, a pair of ridges formed on the other side face at each interface, said ridges extending across said interface and into said grooves along their length with the sides of said ridges engaging the sides of said grooves to form a tight interference fit therebetween.

6. A header block assembly as in claim 5 wherein wire receiving grooves are formed in one side face of each element and ridges are formed on the other side face of each element.

7. A header block assembly as in claim 5 wherein said elements are secured together at said interfaces by a solvent-formed connection.